United States Patent
Ma et al.

(10) Patent No.: US 8,471,770 B2
(45) Date of Patent: Jun. 25, 2013

(54) ANTENNA AND A METHOD OF MANUFACTURING

(75) Inventors: Yugang Ma, Singapore Science Park II (SG); Kenichi Kawasaki, Tokyo (JP)

(73) Assignee: Sony Corporation, Tokyo (JP)

( * ) Notice: Subject to any disclaimer, the term of this patent is extended or adjusted under 35 U.S.C. 154(b) by 346 days.

(21) Appl. No.: 12/938,709

(22) Filed: Nov. 3, 2010

(65) Prior Publication Data

US 2011/0122047 A1    May 26, 2011

(30) Foreign Application Priority Data

Nov. 25, 2009  (SG) .............................. 200907908-8

(51) Int. Cl.
*H01Q 1/38*    (2006.01)
(52) U.S. Cl.
USPC .................................... 343/700 MS; 343/702
(58) Field of Classification Search
USPC .................................... 343/700 MS, 702, 907
See application file for complete search history.

(56) References Cited

U.S. PATENT DOCUMENTS

| 6,373,447 B1 * | 4/2002 | Rostoker et al. | 343/895 |
| 7,586,193 B2 * | 9/2009 | Weste | 257/728 |
| 8,179,333 B2 * | 5/2012 | Rajanish et al. | 343/795 |
| 2009/0195464 A1 * | 8/2009 | Gaucher et al. | 343/702 |

* cited by examiner

*Primary Examiner* — Hoang V Nguyen
(74) *Attorney, Agent, or Firm* — Sony Corporation

(57) ABSTRACT

A method of manufacturing an antenna comprising: providing a millimeter wave (MMW) antenna attached to a signal pad on an integrated circuit mounted on a substrate, and adjusting one or more parameters of the antenna to conform to predetermined desired thresholds, levels or ranges, wherein the adjustment is selected from the group consisting of: locating a conducting or dielectric object at a desired tuner location in proximity to the antenna to tune the central signal frequency, locating a conducting reflector at a desired reflector location in proximity to the antenna to tune the radiation direction or pattern, and selecting a conducting patch or object as a radiator/detector element to modify the bandwidth. Also a millimeter wave (MMW) antenna.

21 Claims, 25 Drawing Sheets

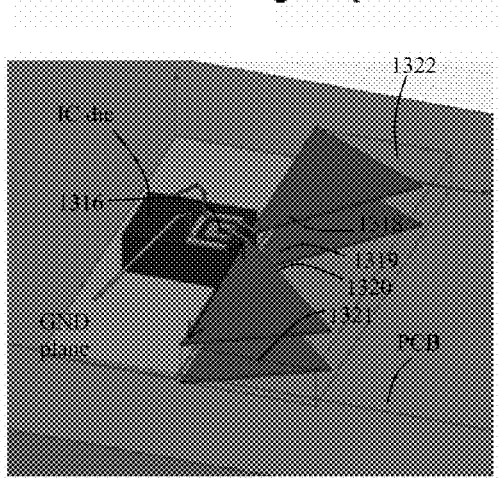
Fig. 13 (a)
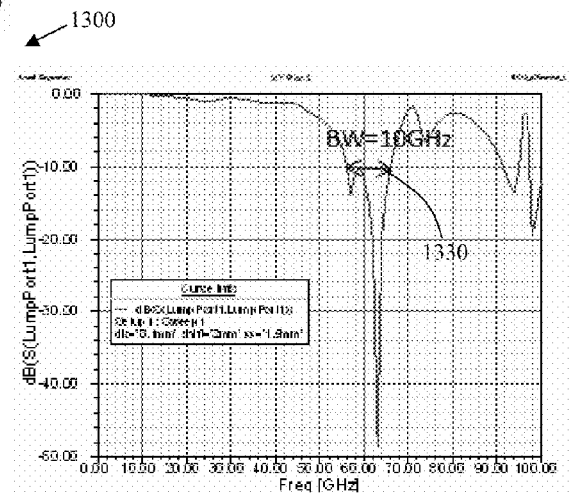
Fig. 13 (b)
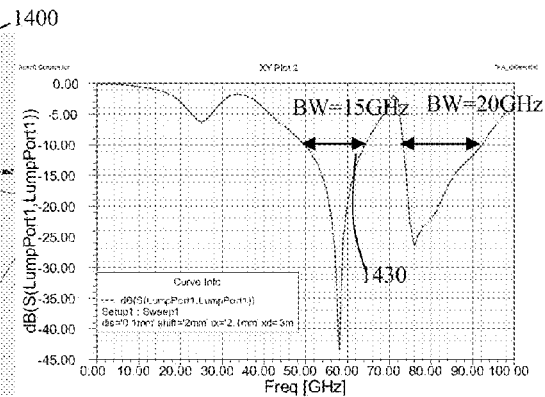
Fig. 14 (a)                    Fig. 14 (b)

ANTENNA AND A METHOD OF MANUFACTURING

CROSS REFERENCE TO RELATED APPLICATIONS

The present application claims priority to Singapore Patent Application 200907908-8 filed in the Singapore Patent Office on Nov. 25, 2009, the entire contents of which is incorporated herein by reference.

FIELD OF THE INVENTION

The present invention relates to a millimeter wave (MMW) antenna and a method of manufacturing an antenna, particularly though not solely to tuning the central signal frequency, radiation direction/pattern and/or the bandwidth of a directional bond wire antenna, patch antenna or box/polygon antenna.

BACKGROUND

In most communications system the antenna is a very important part of the design. In MMW communications systems, the antenna may be very small due to the short wavelength. For such a small size antenna, high radiation efficiency and high coupling efficiency may be important considerations.

A MMW antenna is often made on a printed circuit board (PCB) or other solid substrate. Prior art PCB substrates may have a high loss factor for MMW and hence the radiation efficiency of an antenna built on this kind of substrate may be less than optimal.

One possible improvement is to use special processing on low loss material such as MicroElectroMechanical Systems (MEMS) processing on glass (alumina). However this may involve complex processing and high cost.

The coupler from the IC die to the substrate where the antenna is, may also cause loss. Although the antenna may be located on the IC die (on-chip antenna) to avoid some coupling loss and reduce the size, the radiation efficiency of an on-chip antenna may very low due to the high loss tangent of the IC die.

Another approach is using a bond wire on the signal port on the IC die and design the wire's length and shape so that the bond-wire works as an antenna. Because the bond wire is over air, the loss of the IC die and PCB substrate has little effect to the antenna. Such an antenna is called bond-wire antenna (BWA).

SUMMARY OF THE INVENTION

In general terms the invention proposes to tune a MMW antenna by
locating a conducting or dielectric object at a desired tuner location in proximity to the antenna to tune the central signal frequency,
locating a conducting reflector at a desired reflector location in proximity to the antenna to tune the radiation direction or pattern and/or to increase the bandwidth, and/or
selecting a conducting patch or object as a radiator/detector element to modify the bandwidth.
This may have the advantage(s) that:
the antenna structure may be simple,
the cost of the antenna may be low,
the system implementation may be easy,
frequency and radiation pattern tuning mechanism may be more practical and flexible for the real system and application,
both differential feeding and single ended feeding may be used,
bandwidth may be >15 GHz in case of 60 GHz central signal frequency,
bandwidth may be further widened to 30 GHz by adding a reflector,
bandwidth for the patch antenna with reflector may be 40 GHz in case of 60 GHz central signal frequency,
central signal frequency of the antenna may be tunable by a frequency tuner, and/or
radiation direction/pattern may be tunable by a reflector.

In a first particular expression of the invention there is provided a method of manufacturing an antenna as claimed in claim 1.

In a second particular expression of the invention there is provided a MMW antenna as claimed in claim 21.

BRIEF DESCRIPTION OF THE DRAWINGS

One or more example embodiments of the invention will now be described, with reference to the following figures, in which:

FIG. 13(b), is a graph of the return loss for the tenth example embodiment of FIG. 13(b), FIG. 14(a), is a schematic diagram of a differential fed triangular patch antenna (metal box) according to an eleventh example embodiment, FIG. 14(b), is a graph of the return loss for the eleventh example embodiment of FIG. 14(b), FIG. 15(a), is a schematic diagram of a single-end fed triangle patch antenna (metal box) with reflector according to an twelfth example embodiment.

DETAILED DESCRIPTION

In the following description a number of embodiments are described for tuning or adjusting a MMW antenna. These adjustments would normally occur during manufacturing but might also occur during installation, maintenance or retrofitting to improve performance of an existing antenna. Once the adjustments have been made the antenna may either be left as adjusted or encapsulated in dielectric or resin to prohibit further movement of the components (in this case the components would be sized according to the wavelength in that dielectric and a compensation made in the tuning process). The adjustments may be categorised into:
a. tuning of the central signal frequency,
b. tuning of the radiation direction/pattern, and
c. modifying the bandwidth.

Figure 1A:
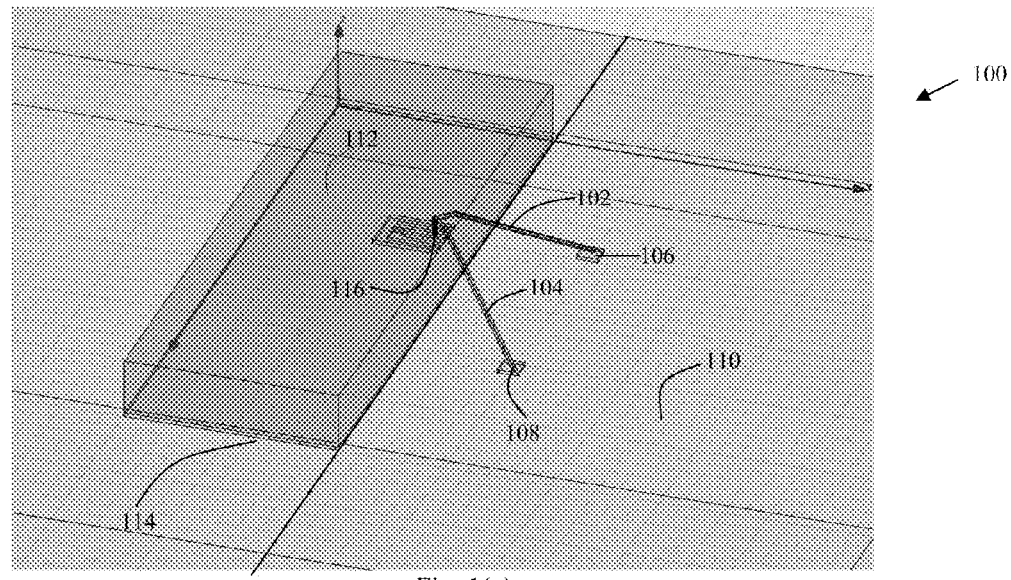
FIG. 1(a), is a schematic diagram of a single fed BWA according to a first example embodiment.
Figure 1B:
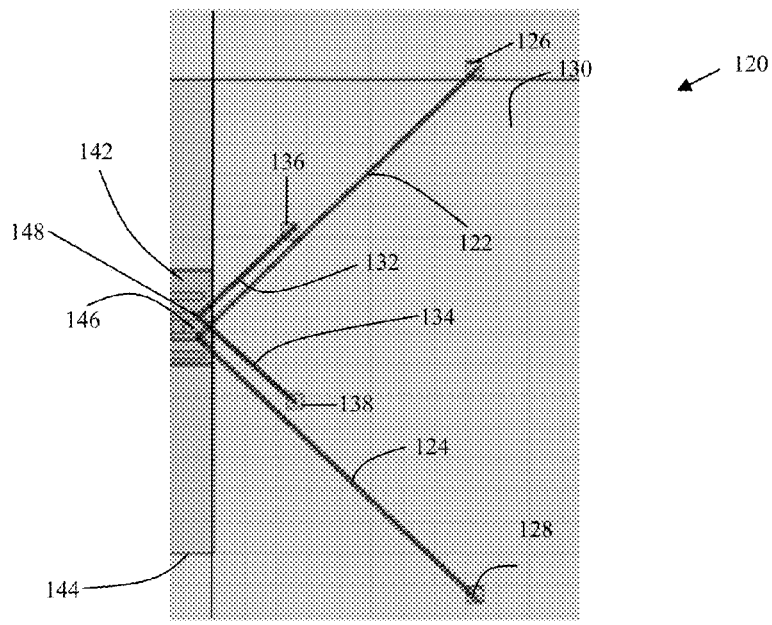
FIG. 1(b), is a schematic diagram of a differential fed BWA according to a second example embodiment.

FIGS. 1(a) and 1(b) show a MMW antenna according to the first and second example embodiments. In the first and second example embodiments the antenna is a BWA surrounded by air. In FIG. 1(a) the antenna 100 according to the first example embodiment is a single-end feed BWA. There are two bond wires 102,104 attached to two small bond pads (0.1 mm×0.1 mm) 106, 108 on a PCB substrate 110. An integrated circuit 112 is mounted on a ground plane 114 which in turn is mounted on the substrate 110. The ground plane 114 only extends to the edges of the integrated circuit 112, although the size of the ground plane may be bigger eg: greater than two wavelengths wide and greater than one wavelength long. The ground plane is grounded via bond wires attached to a ground pad on the integrated circuit 112. The other ends of the bond wires 102,104 are commoned together and connected to a signal pad 116 on the integrated circuit 112. The bond wires are arranged orthogonally (although anywhere from an angle of 60 to 120 degrees is possible), and are approximately a quarter wavelength at the central signal frequency. The single-end fed BWA 100 works as a monopole antenna with two arms. The wires are generally oriented in a straight line.

In FIG. 1(b) the antenna 120 according to the second example embodiment is a differential fed BWA. There are two longer bond wires 122,124 attached to two small distant bond pads 126,128 mounted on a PCB substrate 130, and two shorter bond wires 132,134 attached to two small closer bond pads 136,138. The two longer bond wires 122,124 are about three quarter wavelength and the two shorter bond wires 132,134 are about quarter wavelength. Again an integrated circuit 142 is mounted on a ground plane 144 which in turn is mounted on the substrate 130. The ground plane ground plane 144 only extends to the edges of the integrated circuit 142. The other ends of the longer bond wires 122,124 are commoned together and connected to a first signal pad 146 on the integrated circuit 142. The other ends of the shorter bond wires 132,134 are commoned together and connected to a second signal pad 148 on the integrated circuit 142. The differential fed BWA 120 works as a J-pole antenna with two arms in positive and negative ports, respectively.

Because the two-wire design, the BWAs' 100, 120 bandwidth may be enlarged. For example, the differential fed BWA 120 according to the second example embodiment may have a bandwidth of 15 GHz at a central signal frequency of 60 GHz (relative bandwidth >25%).

A possible problem for the BWA 100, 120 of the first and second example embodiments may be that the wire bond geometry may make it difficult to consistently manufacture an antenna with parameters within a small tolerance, especially when bonding wires are manually bonded. In certain applications it may be useful for the central signal frequency and/or radiation beam pattern to be within a predetermined tolerance.

Tuning of the Central Signal Frequency

Figure 2:
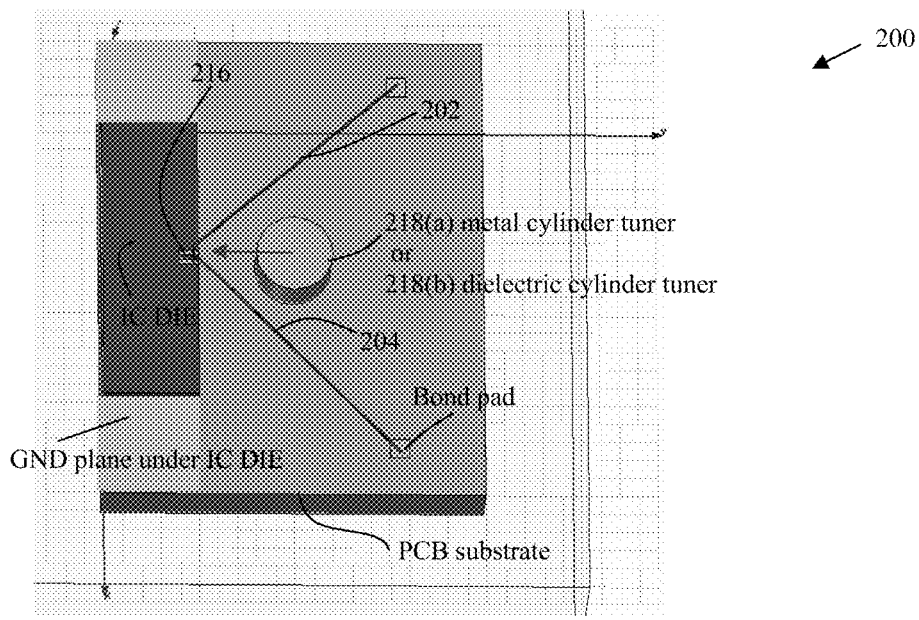
FIG. 2, is a schematic diagram of a differential fed BWA with cylindrical frequency turner according to a third and a forth example embodiment.

Depending on the application it may be desirable to modify the central signal frequency. Accordingly, FIG. 2 shows a differential feeding BWA 200 with frequency tuner 218 according to the third and forth example embodiments. The central signal frequency can be tuned by approaching a dielectric cylinder 218(b) between the two wires 202,204 from far to the feeding point 216 according to the third example embodiment. In this case, the resonant frequency or central signal frequency of the antenna becomes lower. The cylinder may have a diameter of 0.3 mm and height of 0.3 mm, with dielectric constant 10 and loss tangent 0.001.

Alternatively, a metal cylinder 218(a) according to the forth example embodiment approaches to the feeding point can make the antenna resonant frequency higher. The cylinder may be a hollow copper cylinder, with the same size as the dielectric cylinder.

Figure 3A:
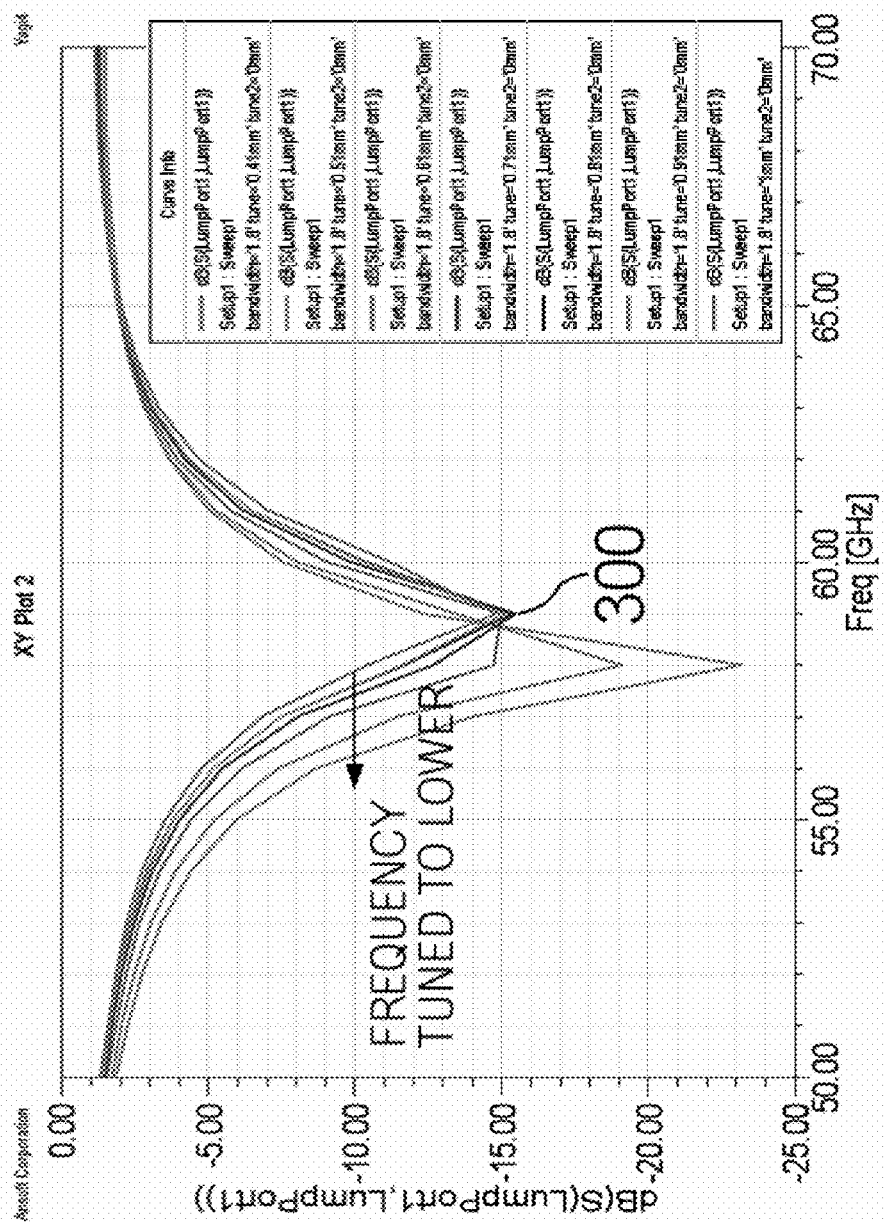
FIG. 3(a), is a graph of return loss (S11) for the third example embodiment of FIG. 2, FIG. 3(b), is a graph of return loss (S11) for the forth example embodiment of FIG. 2, FIG. 4, is a schematic diagram of a single-end fed BWA with triangular dielectric tuner according to a fifth example embodiment.
Figure 3B:
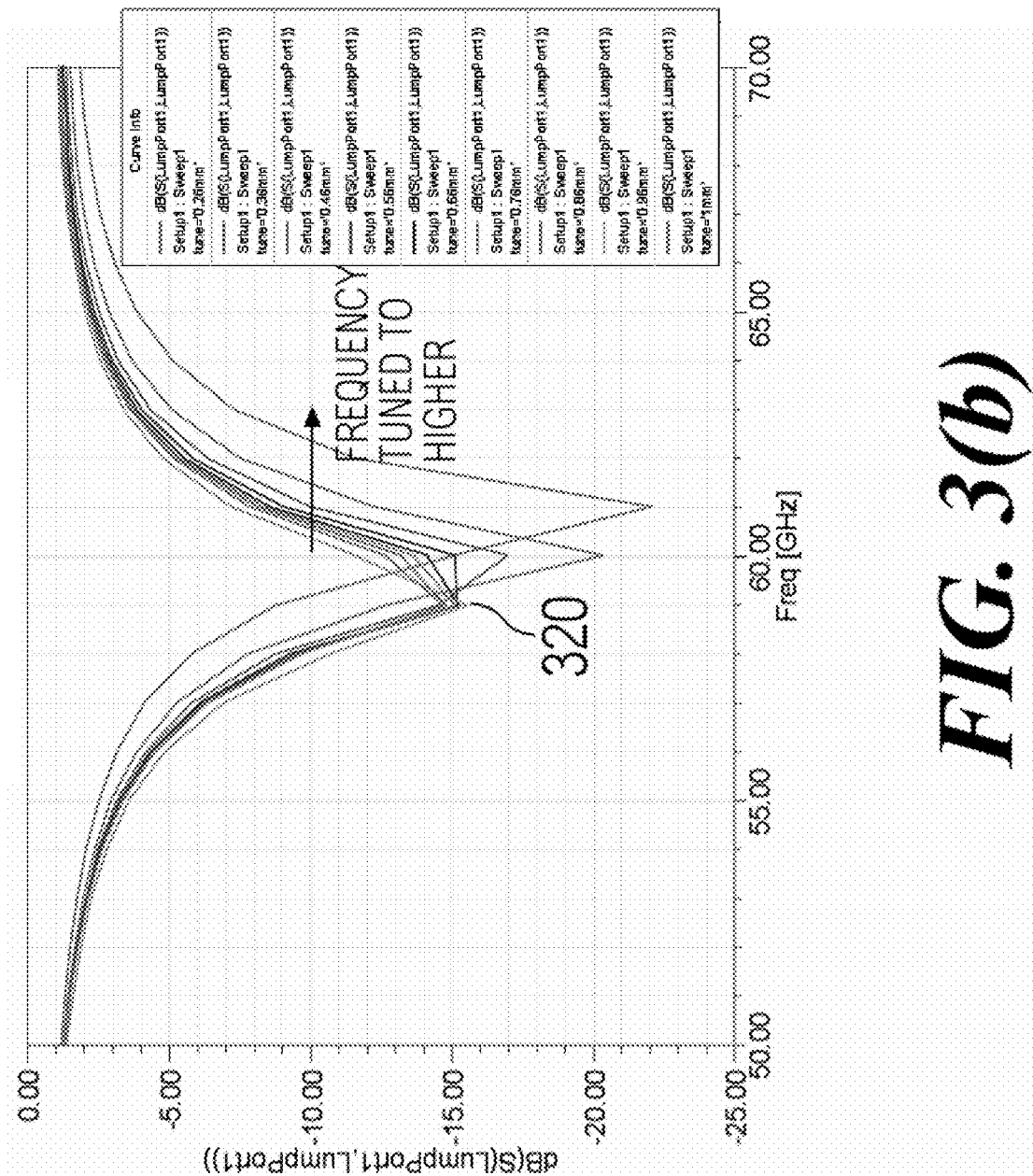

FIG. 3 shows the return loss of the BWA with cylinder tuner according to the third and forth example embodiments. In FIG. 3(a) the central signal frequency 300 becomes lower with the distance between a dielectric cylinder 218(b) and feeding point 216 reducing. In FIG. 3(b) the BWA central signal frequency 302 increases with the distance between a metal cylinder 218(a) and the feeding point 216 reducing.

In order to tune the antenna 200 according to the third or forth example embodiments, the cylinder 218 is located in various positions and the central signal frequency is tested until it is within the desired range. The cylinder 218 is then fixed in place by pasting it on the substrate 230.

Figure 4:
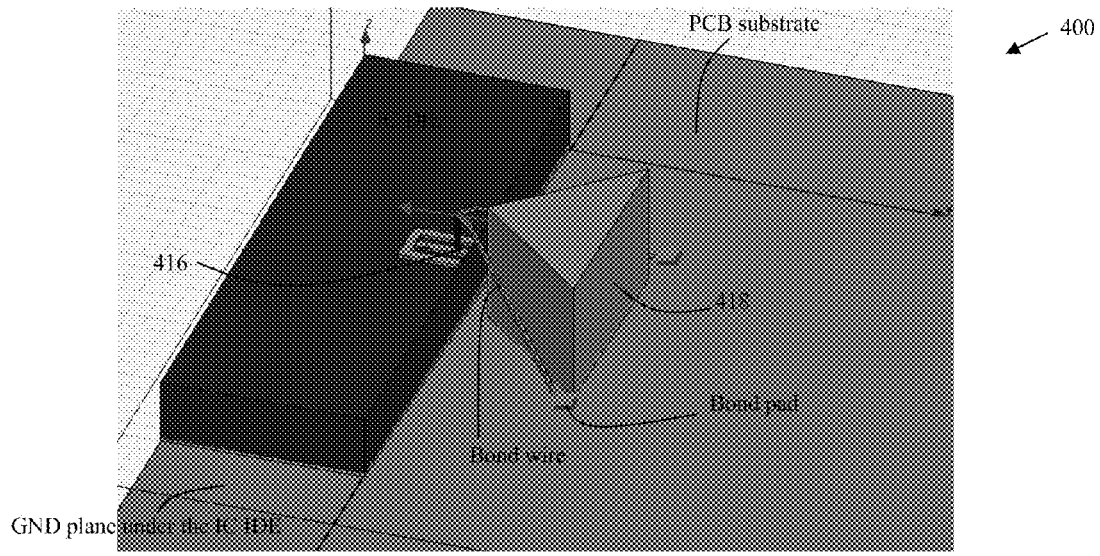

FIG. 4 shows a single-ended BWA 400 with frequency tuner 418 according to a fifth example embodiment. The central signal frequency may be more significantly changed by using a triangular dielectric tuner 418.

Figure 5:
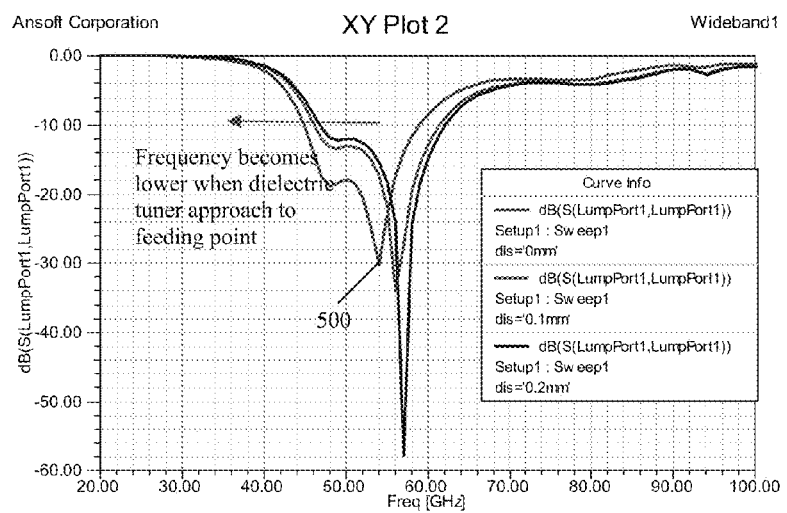
FIG. 5, is a graph of return loss (S11) for the fifth example embodiment in FIG. 4, FIG. 6(a), is a graph of the radiation pattern for the first example embodiment of FIG. 1(a), FIG. 6(b), is a graph of the return loss for the first example embodiment of FIG. 1(a), FIG. 6(c), is a graph of the radiation pattern for the second example embodiment of FIG. 1(b), FIG. 6(d), is a graph of the return loss for the second example embodiment of FIG. 1(b), FIG. 7, is a schematic diagram of a single-end fed BWA according to a sixth example embodiment with a reflector pasted in a first location.
Figure 6A:
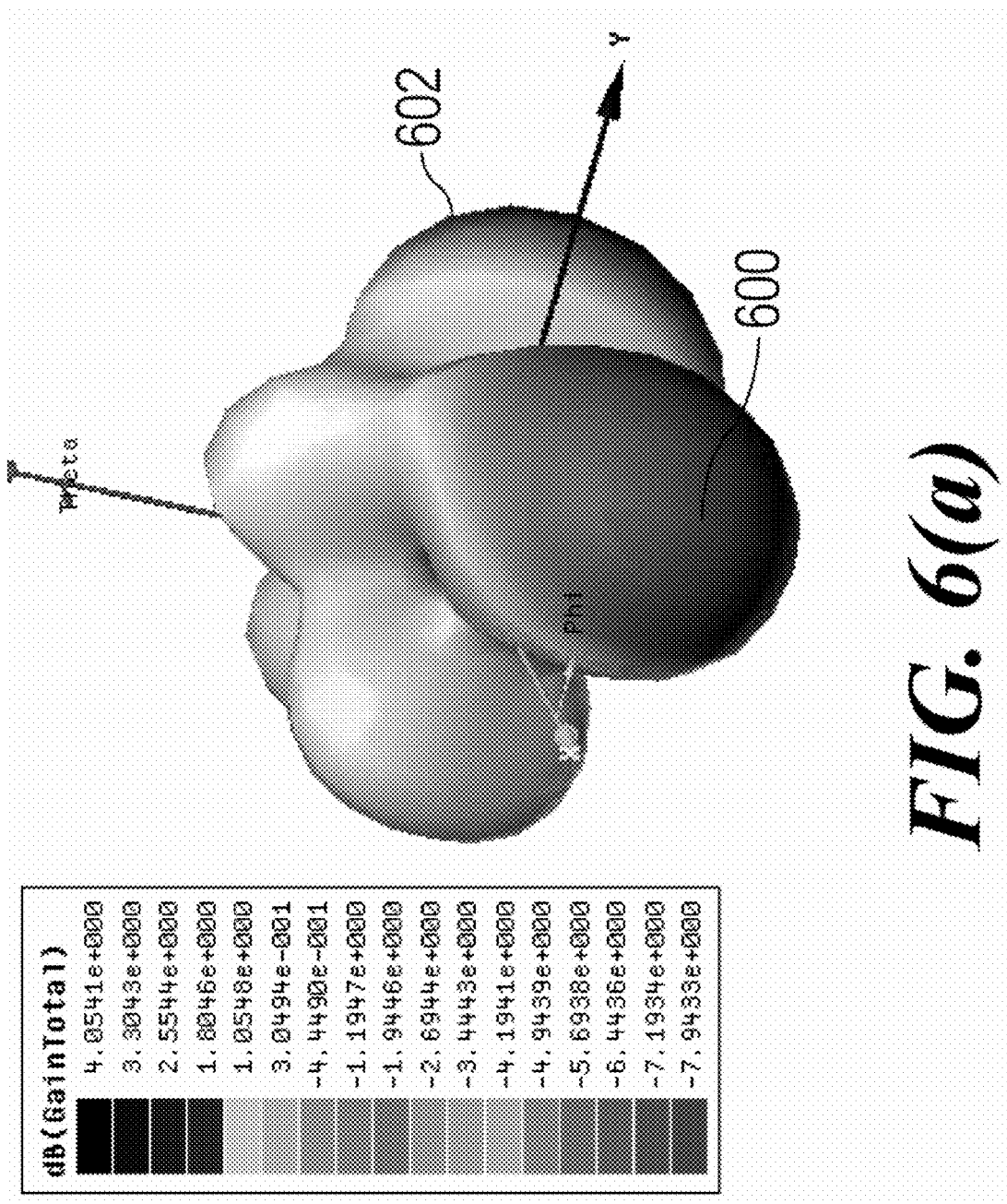
Figure 6B:
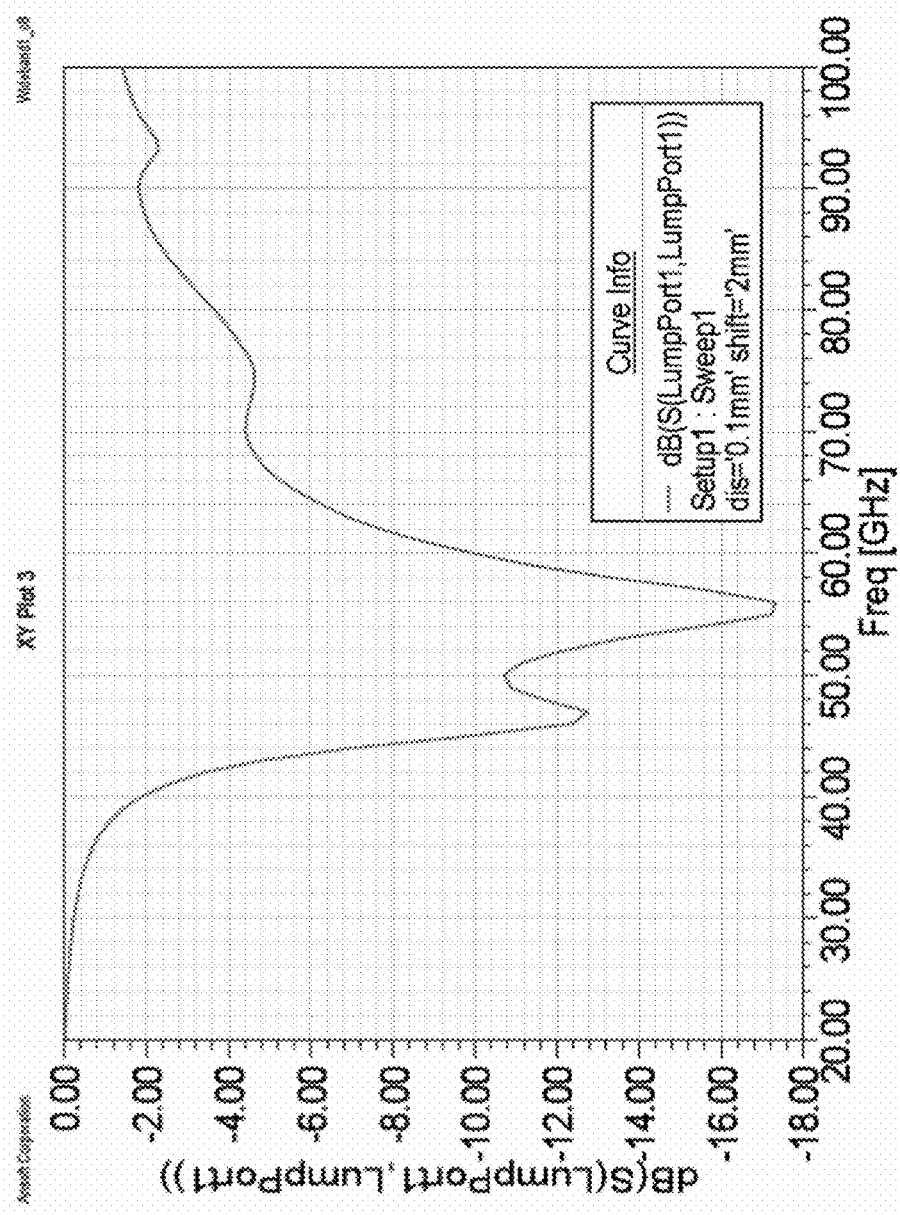
Figure 6C:
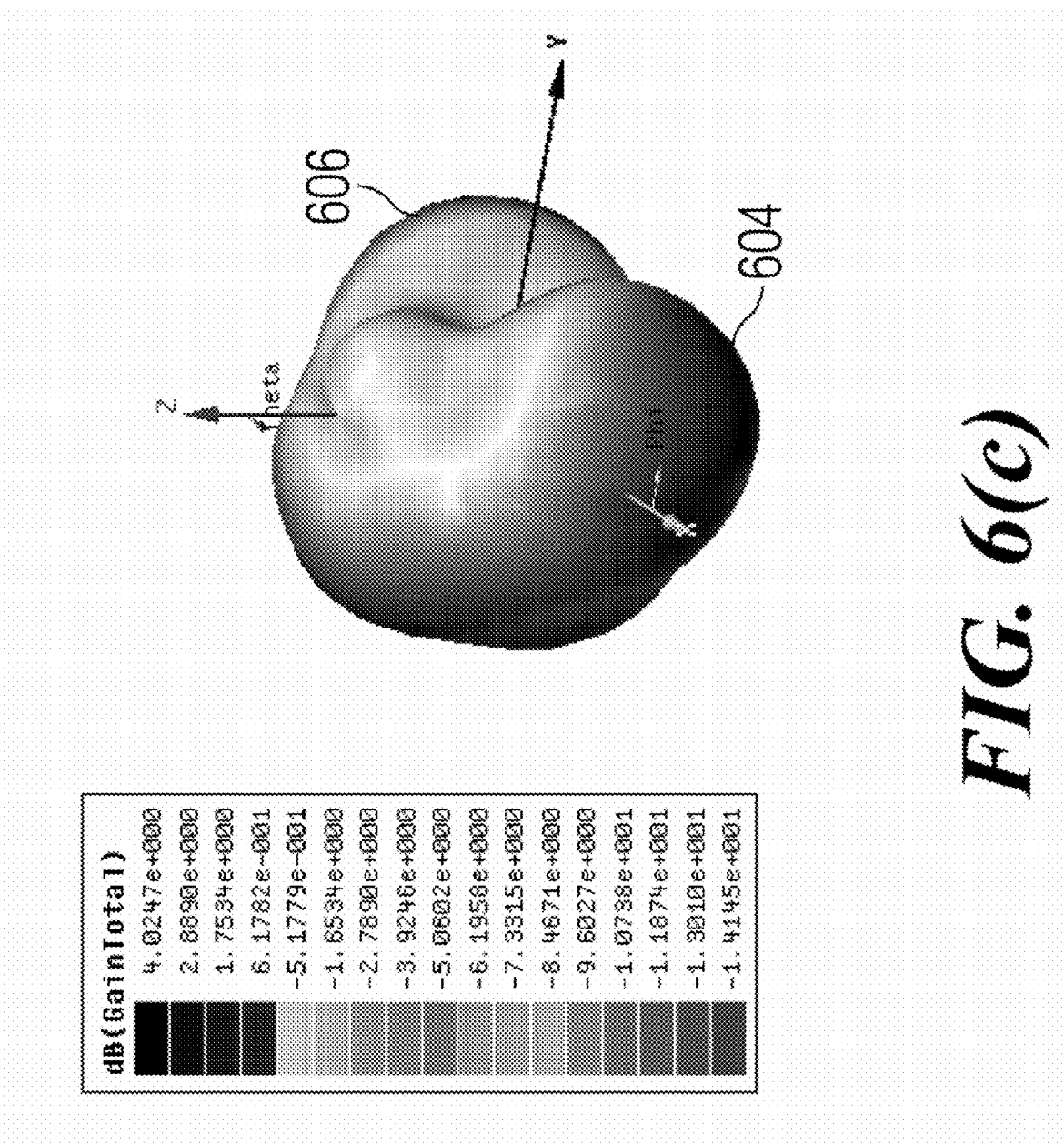
Figure 6D:
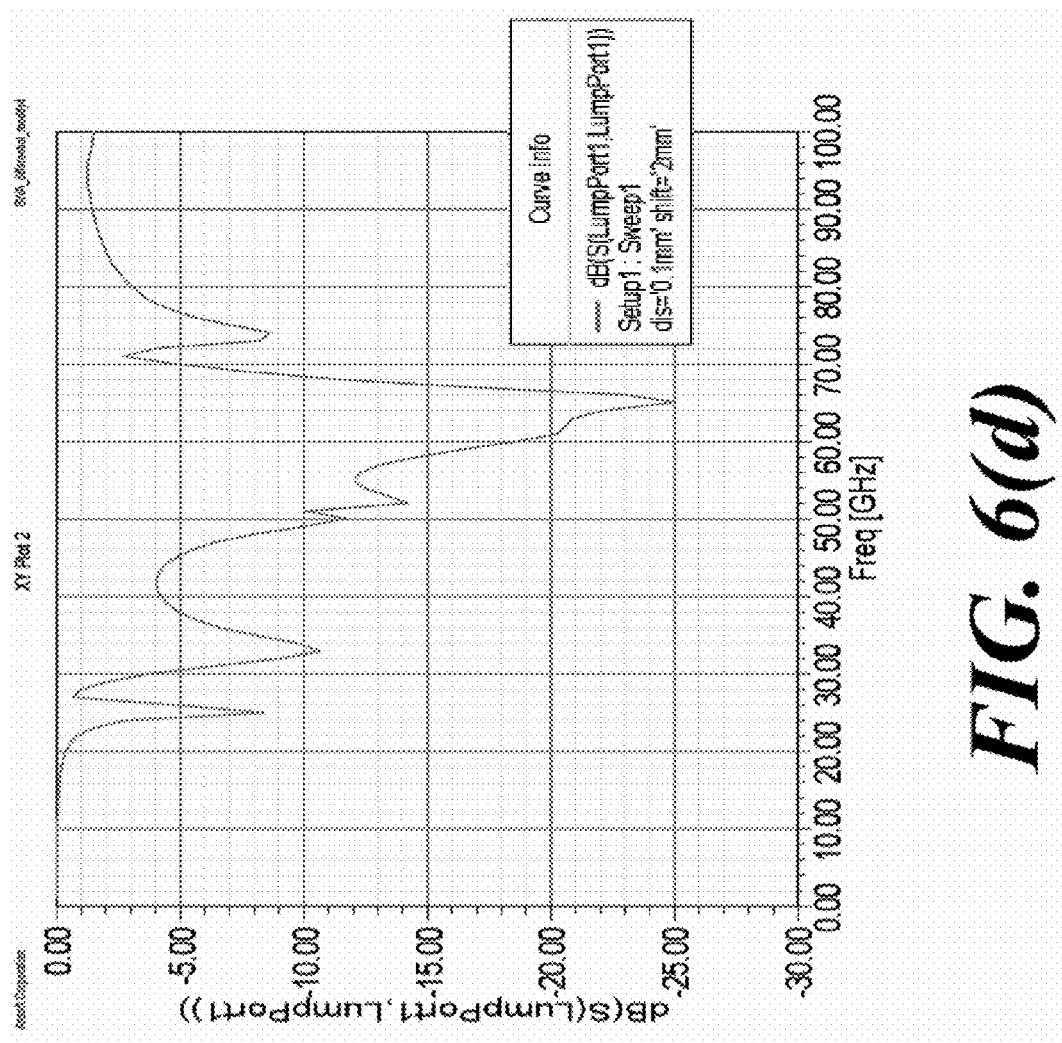

FIG. 5 shows the return loss of the BWA 400 with triangular tuner 418 according to the fifth example embodiment. The central signal frequency 500 becomes lower when the triangular dielectric tuner 418 approaches to the feeding point 416.

Again in order to tune the antenna 400 according to the fifth example embodiment, the triangular dielectric tuner 418 is located in various positions and the central signal frequency is tested until it is within the desired range. The cylinder 418 is then fixed in place by pasting it on the substrate 430.

Alternatively if the wires are encapsulated in resin the central frequency may be tuned after encapsulation. One method of doing this would be to drill a hole in the resin, where the significance of the hole would be used in tuning, eg: the deeper or wider the hole, the higher the central signal frequency.

Tuning of the Radiation Direction/Pattern

FIG. 6(a) to FIG. 6(d) show the radiation pattern and return loss of the first and second example embodiments. The maximum gain directions 600,602 and 604,606 are two diagonal directions (approximately about x=y and x=−y or 45 and 135 degrees from the x axis) in the PCB substrate plane (x,y plane, z=0).

Figure 7:
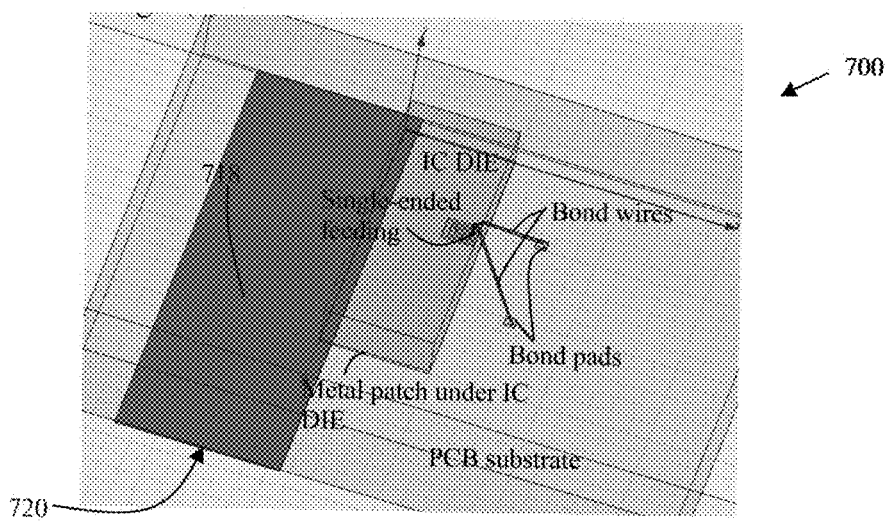

Depending on the application it may be desirable to modify the radiation direction or pattern. According to the sixth example embodiment 700 shown in FIG. 7, a reflector 718 is positioned at a first location 720 on the back side of a PCB substrate 710. The reflector is floating and may be copper. The reflector 718 may be greater than two wavelengths wide and greater than one wavelength long. The first location 720 is about in line with the back side of the integrated circuit distant from the signal pad. The substrate may for example be 0.625 mm thick. If the reflector is designed within the near field of the antenna, it may be used to effect the radiation pattern and the bandwidth.

Figure 8A:
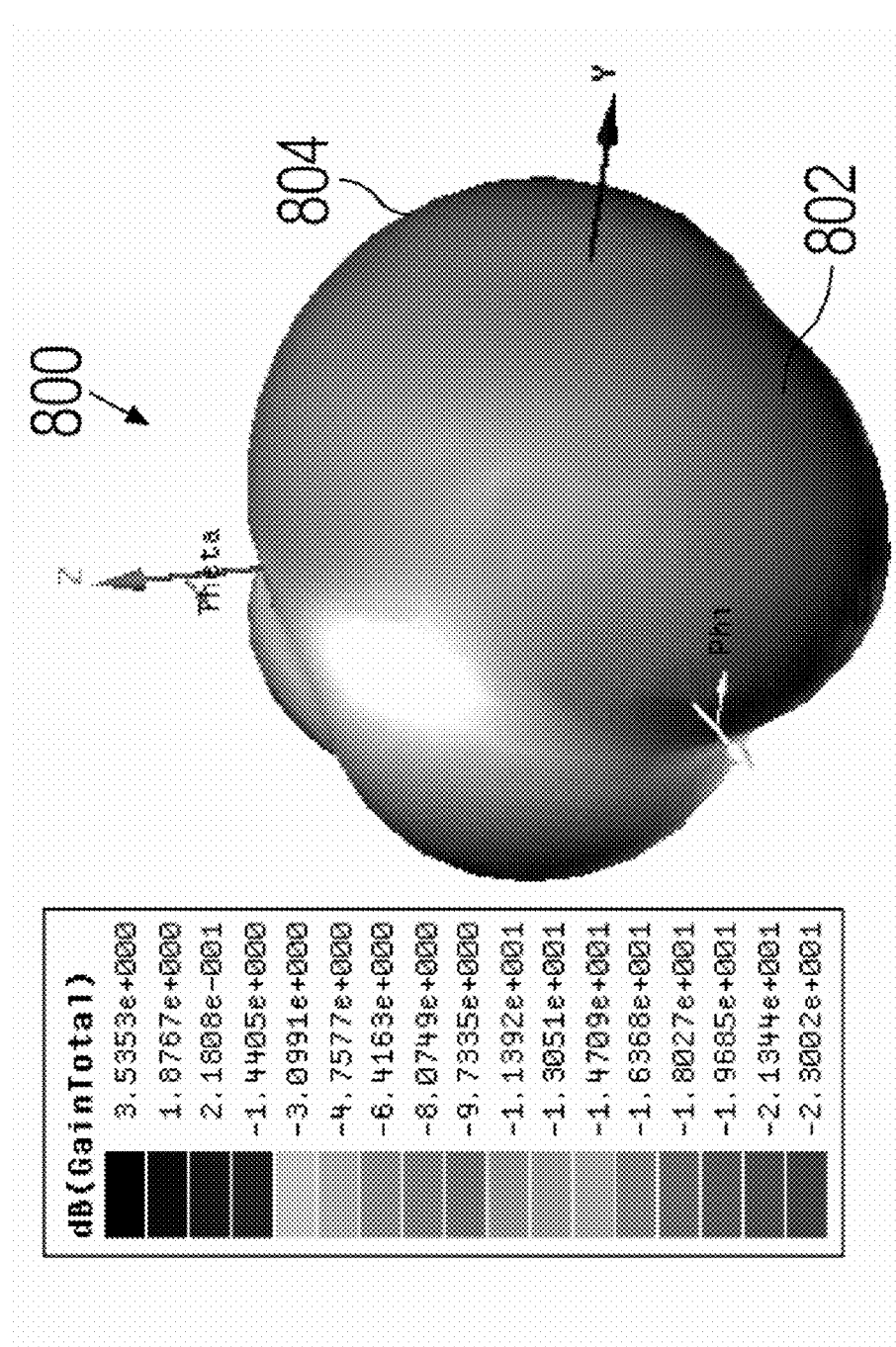
FIG. 8(a), is a graph of the radiation pattern for the sixth example embodiment of FIG. 7, FIG. 8(b), is a graph of the return loss for the sixth example embodiment of FIG. 7, FIG. 9, is a schematic diagram of a single-end fed BWA according to a seventh example embodiment with a reflector pasted in a second location.
Figure 8B:
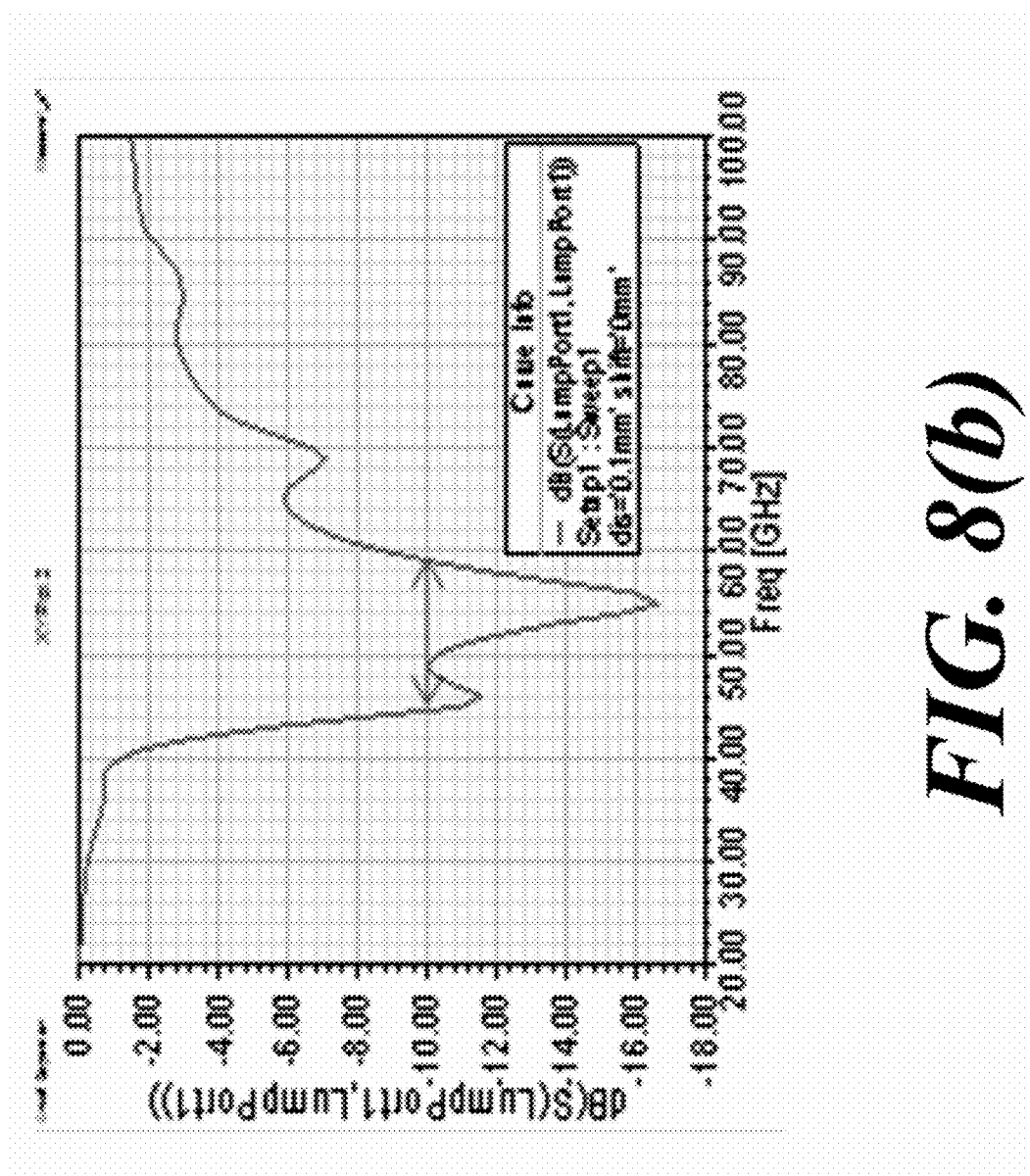

FIG. 8(a) shows the radiation pattern 800 change by introducing the reflector 718 in this first location 720. The maximum radiation directions are still two diagonal directions (approximately about x=y and x=−y or 45 and 135 degrees from the x axis) however the radiation is much more uniform becoming more omnidirectional in the positive y direction.

Figure 9:
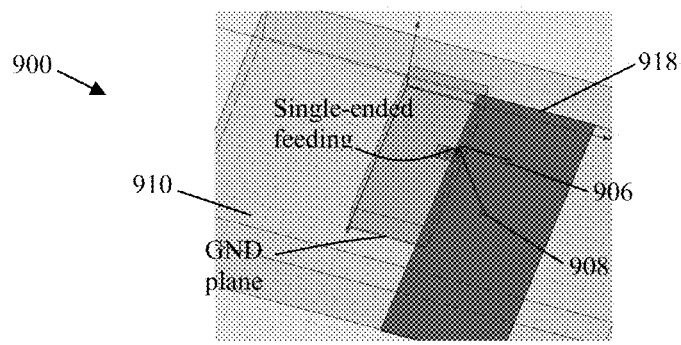

FIG. 9 shows another reflector 918 located at second location 920 approximately around the bond pads 906,908 underneath the substrate 910. to change the radiation direction according to the seventh example embodiment 900. The second location 920 is adjacent a front side of the integrated circuit proximate from the signal pad.

Figure 10A:
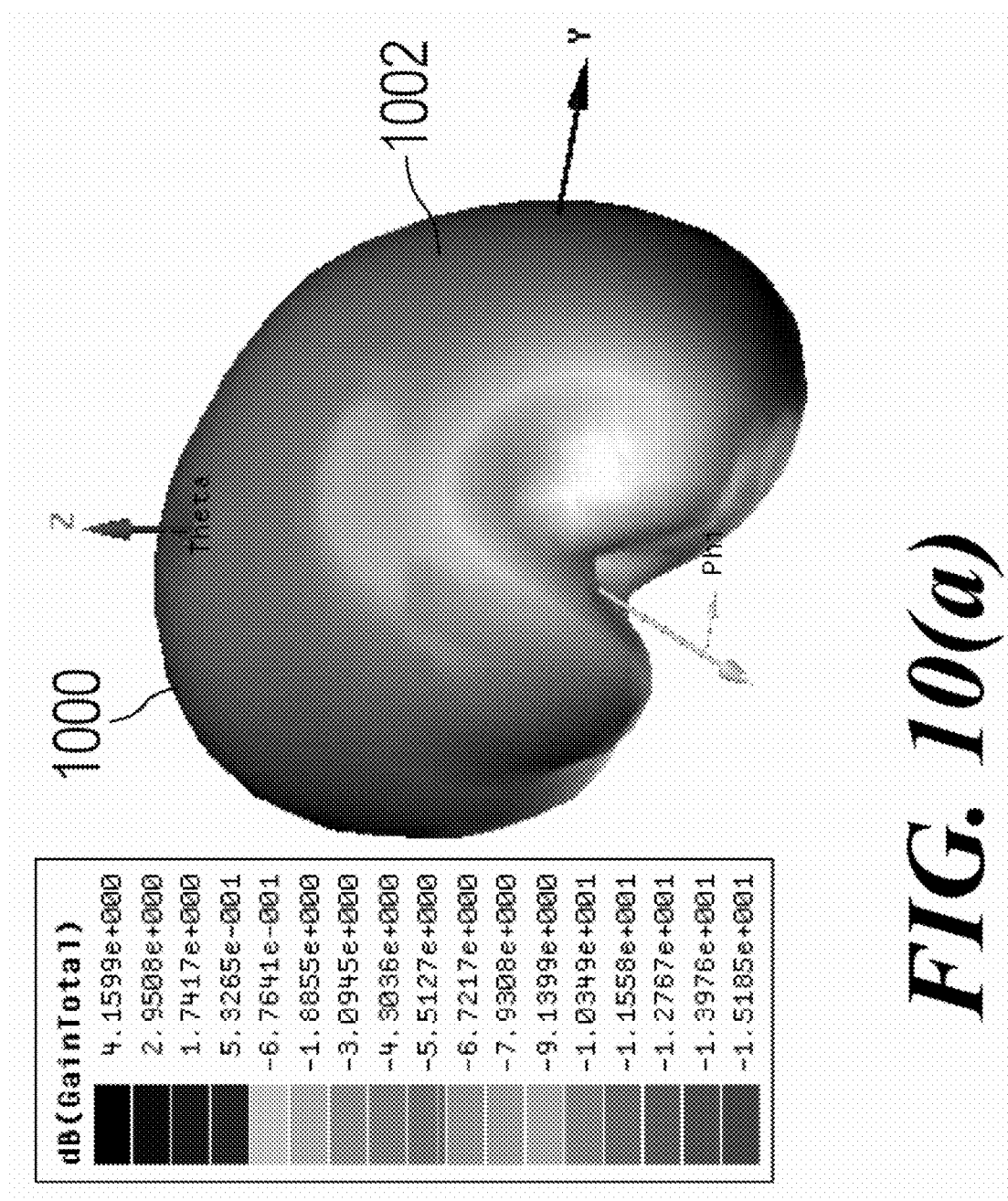
FIG. 10(a), is a graph of the radiation pattern for the seventh example embodiment of FIG. 9, FIG. 10(b), is a graph of the return loss for the seventh example embodiment of FIG. 9, FIG. 11(a), is a schematic diagram of a single-end fed triangle patch antenna (metal box) according to an eight example embodiment.
Figure 10B:
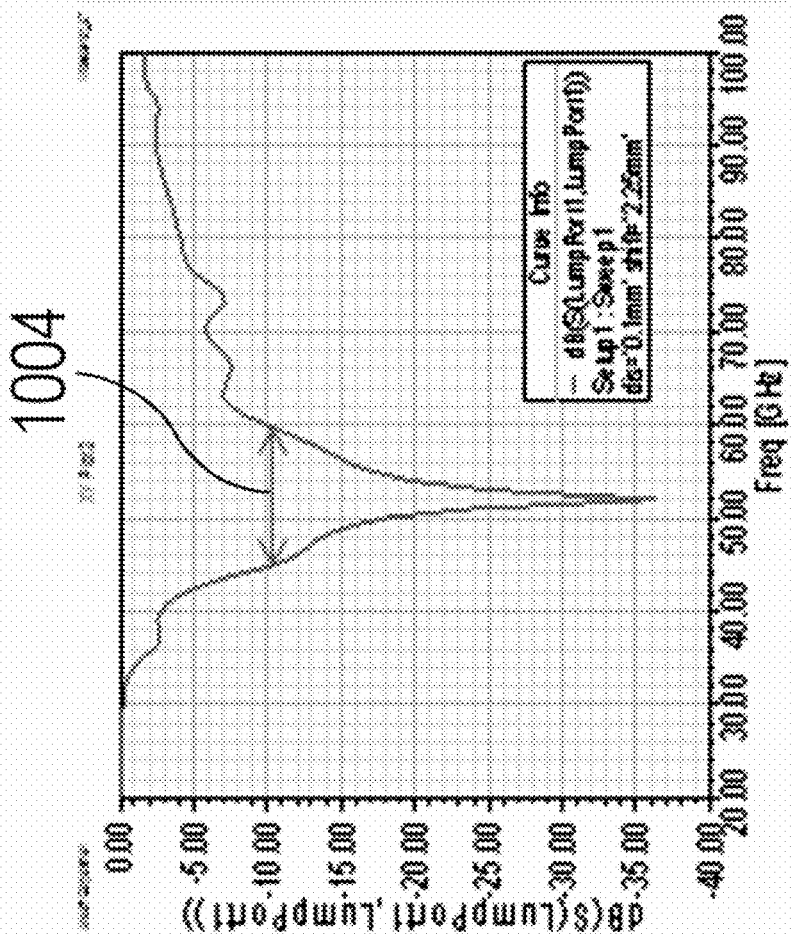

FIG. 10(a) shows that the maximum radiation direction may be modified to the vertical direction (z-axis) 1000 and forward direction (y-axis) 1002 if the reflector 918 is at the second location 920. Also as shown in FIG. 10(b) the reflector 918 underneath under the BWA 900, the BWA signal bandwidth 1004 can be enlarged to as much as 30 GHz at a 60 GHz central signal frequency (relative bandwidth >50%).

Modifying the Bandwidth

Depending on the application it may be desirable to modify the bandwidth. For example metal patches as the radiation element may be used to increase the bandwidth.

Figures 11A, 11B:
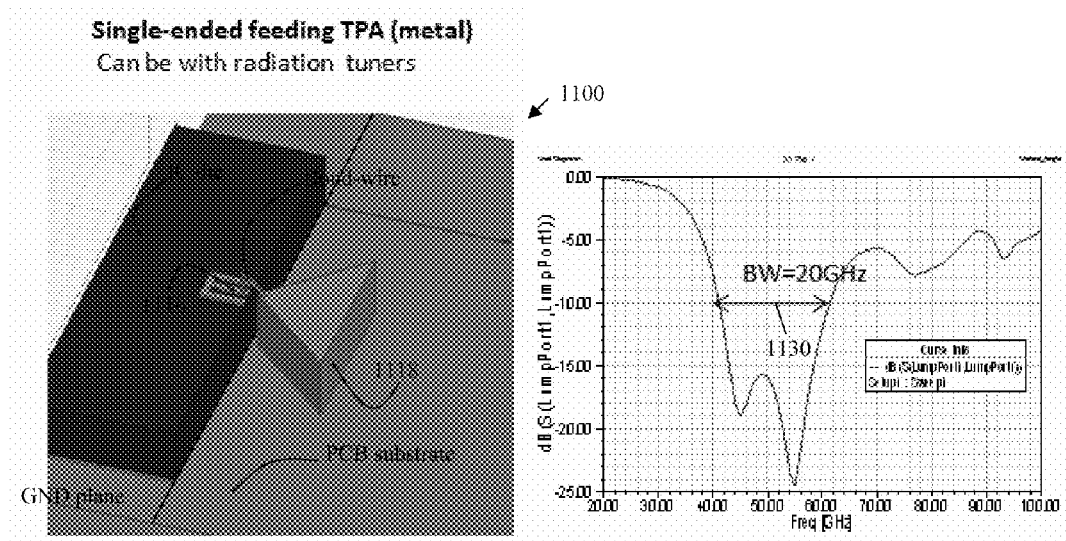
FIG. 11(b), is a graph of the return loss for the eighth example embodiment of FIG. 11(b), FIG. 12(a), is a schematic diagram of a single-end fed triangular patch antenna (2-layer ceramic PCB box) according to a ninth example embodiment.

FIG. 11(a) shows an antenna 1100 according to the eighth example embodiment with a single-end fed 1116 triangle patch/metal box 1118 as the radiator/detector element. FIG. 11(b) shows the bandwidth 1130 achieved is 20 GHz.

The box 1118 is a hollow metal box made from copper. The box 1118 is 1.1 mm wide and 0.6 mm long with a height of 0.3 mm. In plan view it may be an isosceles triangle, with the two equal angles being less than 60 degrees, for example 30 degrees. The feed 1116 is attached to the adjacent apex of the two equal short sides and the long unequal side is distant from the feed 1116. The apex is spaced approximately 50 microns from the integrated circuit. The box 1118 is attached to the substrate and the integrated circuit is attached to a ground plane on the substrate.

Figures 12A, 12B:
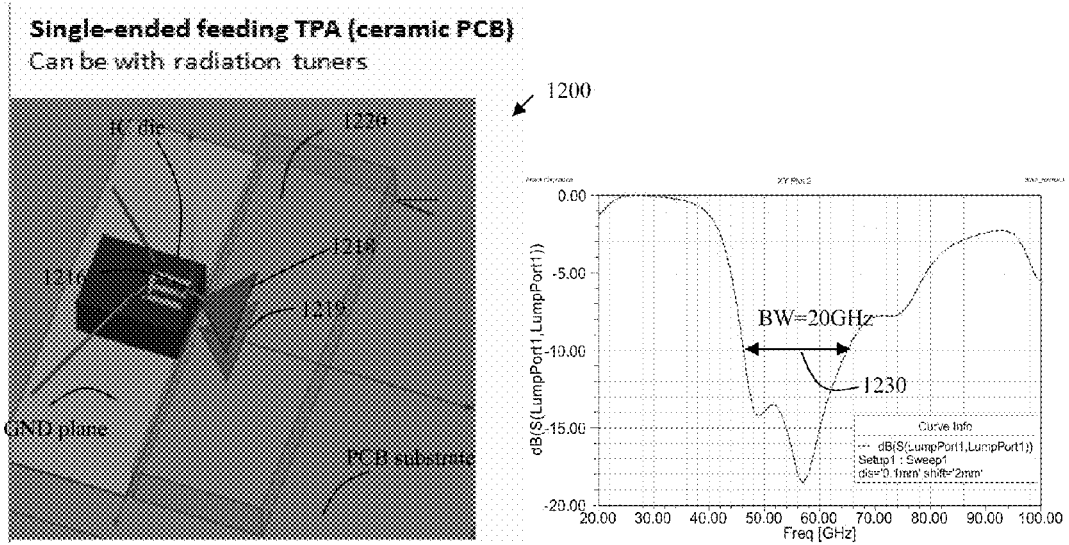
FIG. 12(b), is a graph of the return loss for the ninth example embodiment of FIG. 12(b), FIG. 13(a), is a schematic diagram of a differential fed triangular patch antenna (2-layer ceramic PCB box) according to an tenth example embodiment.

FIG. 12(a) shows an antenna 1200 according to the ninth embodiment with a single-end fed 1216 triangular patches 1218,1219 as the radiator/detector element separated by a 2-layer ceramic box 1220. FIG. 12(b) shows the bandwidth 1230 achieved is 20 GHz.

The patches 1218,1219 are 0.7 mm wide and 0.38 mm long. In plan view they may be an isosceles triangle, with the two equal angles being less than 60 degrees, for example 30 degrees. The feed 1216 is attached to the adjacent apex of the two equal short sides of the top patch 1218 and the long unequal side is distant from the feed 1216. The apex is spaced approximately 50 microns from the integrated circuit. The bottom patch 1219 is attached to the substrate and the integrated circuit is attached to a ground plane on the substrate. The ceramic box 1220 is 1 mm long, 3 mm wide and 0.254 mm high. The ceramic box may be made from quart with a dielectric constant of 9.1 and a loss factor of 0.

FIG. 13(a) shows an antenna 1300 according to the tenth embodiment with a differential fed 1316 triangular patches 1318, 1319, 1320, 1321 as the radiator/detector element separated by a 2-layer ceramic PCB box 1322. FIG. 13(b) shows the bandwidth 1330 achieved is 10 GHz.

The patches 1318, 1319, 1320, 1321 are 1.475 mm wide and 0.95 mm long. The are spaced 50 micron from each other and from the integrated circuit. In plan view they may be an isosceles triangle, with the two equal angles being less than 60 degrees, for example 30 degrees. The feed 1316 is attached to the adjacent corner of the two the top patches 1318,1320 and the apex of all of the patches 1318, 1319, 1320, 1321 is distant from the integrated circuit. The ceramic box 1322 may be the same as in the ninth embodiment.

FIG. 14(a) shows an antenna 1400 according to the eleventh embodiment with a differential fed 1416 double triangular patch antenna (metal box) 1418,1419 as the radiator/detector element. The geometry and orientation of the boxes 1418,1419 may similar to the patches 1318, 1319, 1320, 1321 in the tenth embodiment except with a height of FIG. 14(b) shows the bandwidth 1430 achieved is 15 GHz with another band of 20 GHz at a higher frequency.

Figure 15A:
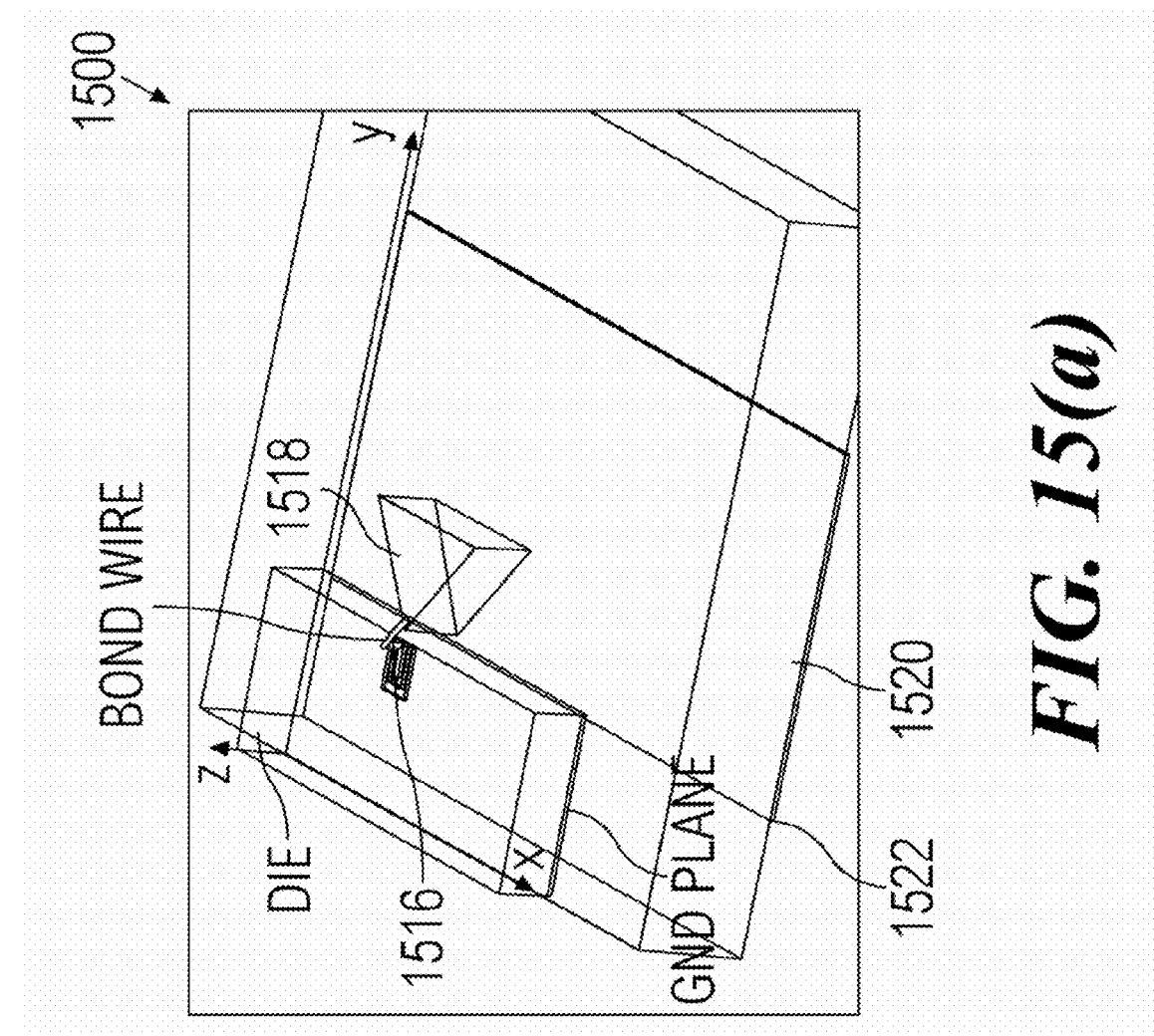
FIG. 15(b), is a graph of the return loss for the twelfth example embodiment of FIG. 15(b), FIG. 15(c), is a graph of the radiation pattern for the twelfth example embodiment of FIG. 15(b), FIG. 16(a), is a schematic diagram of 6-side metal polygon antenna according to an thirteenth example embodiment.
Figure 15B:
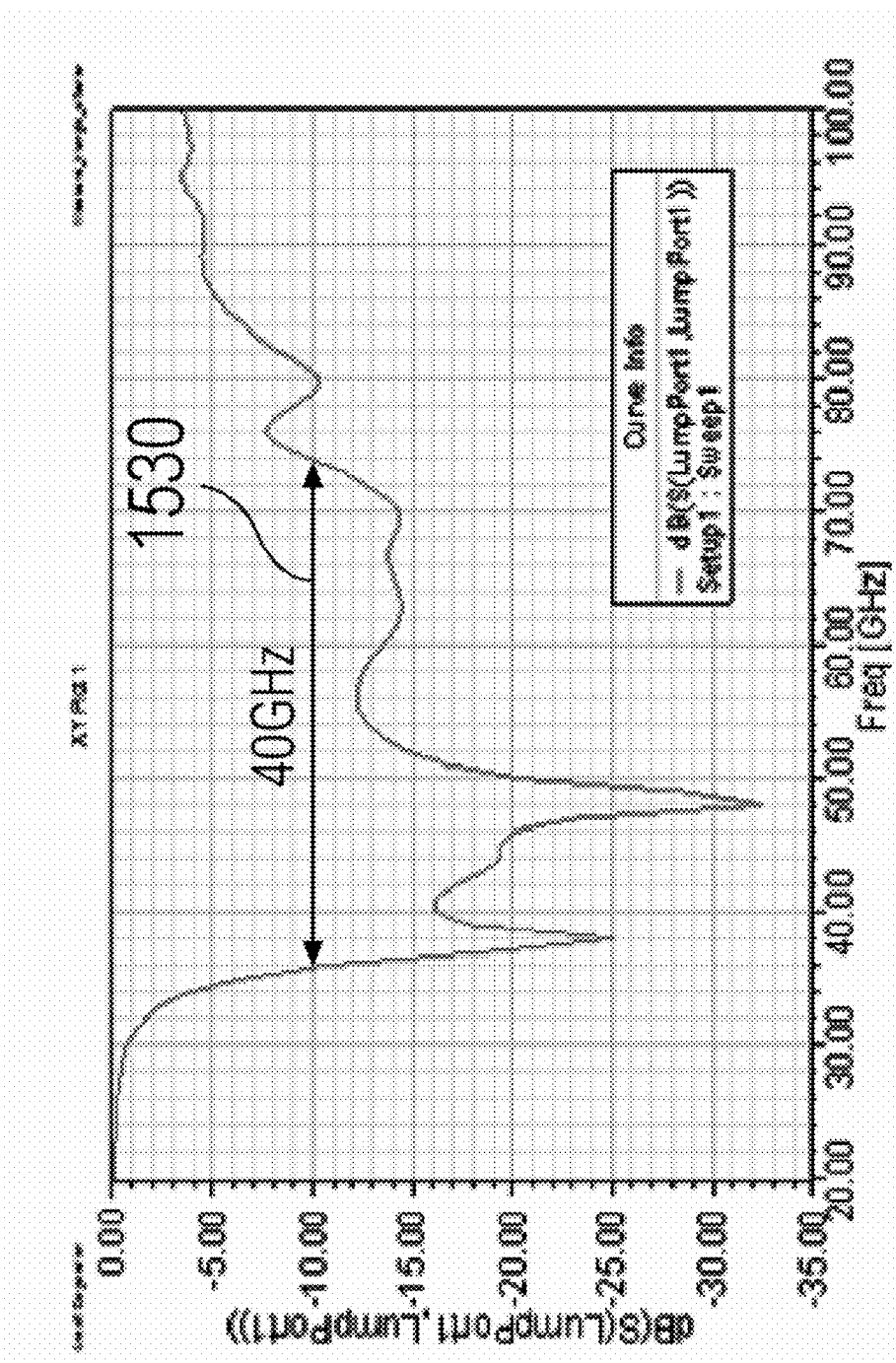
Figure 15C:
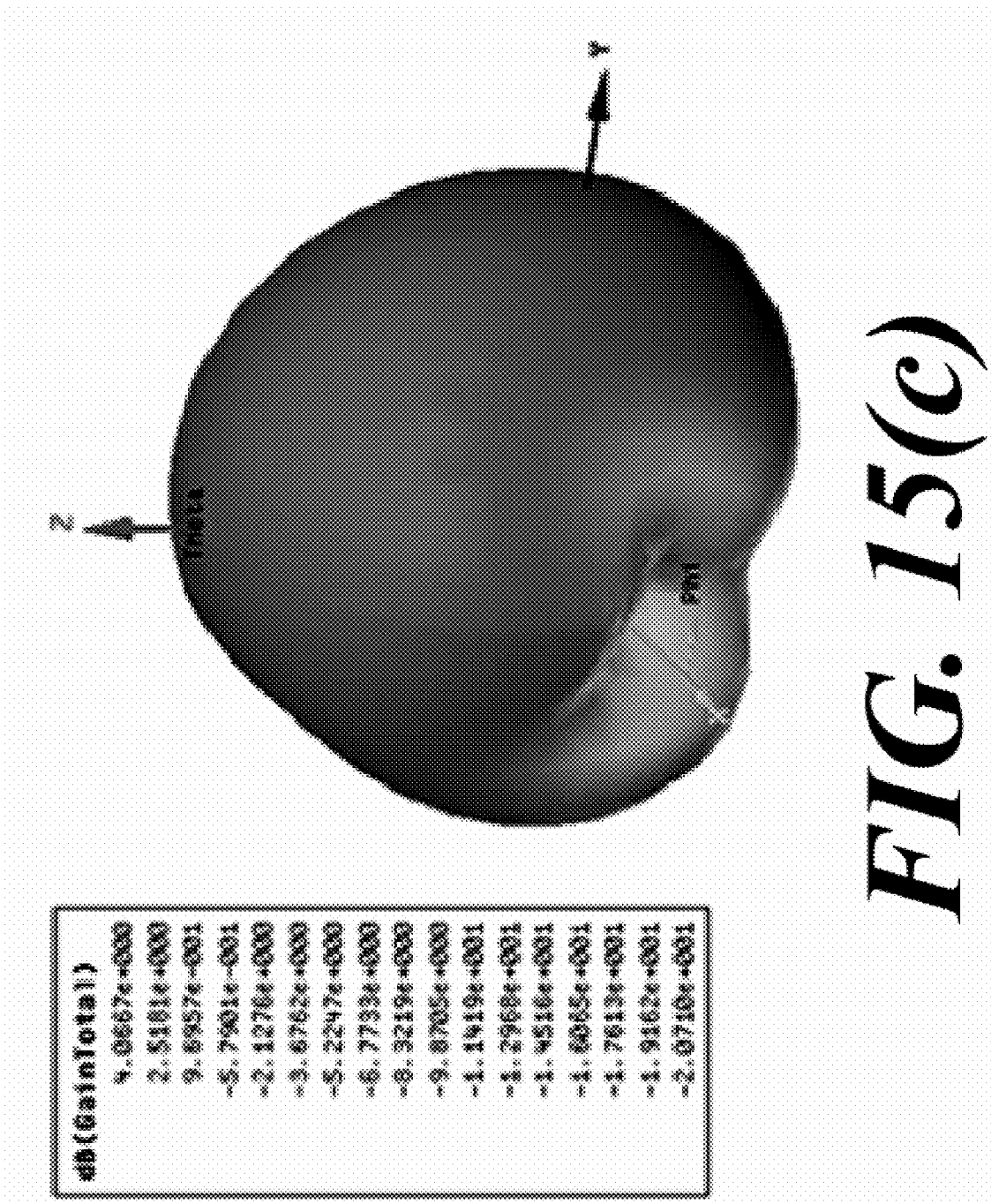

FIG. 15(a) shows an antenna 1500 according to the twelfth embodiment with a single-end fed 1516 triangle patch (metal box) 1518 as the radiator/detector element with a reflector 1520 in the second location 1522. FIG. 15(b) shows the bandwidth 1530 achieved is 40 GHz. The box is similar to that in the eighth embodiment and the reflector is similar to that the seventh embodiment.

Figure 16A:
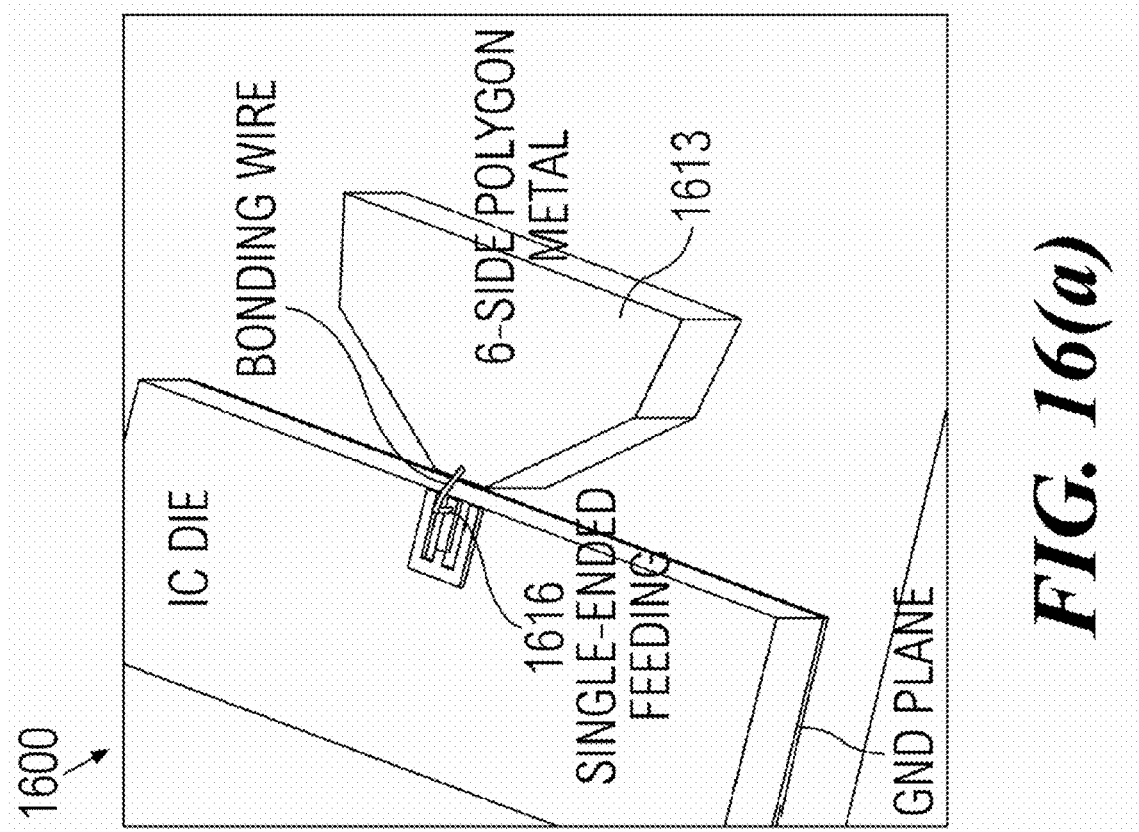
FIG. 16(b), is a graph of the return loss for the thirteenth example embodiment of FIG. 16(b), FIG. 16(c), is a graph of the radiation pattern for the thirteenth example embodiment of FIG. 16(b)
Figure 16B:
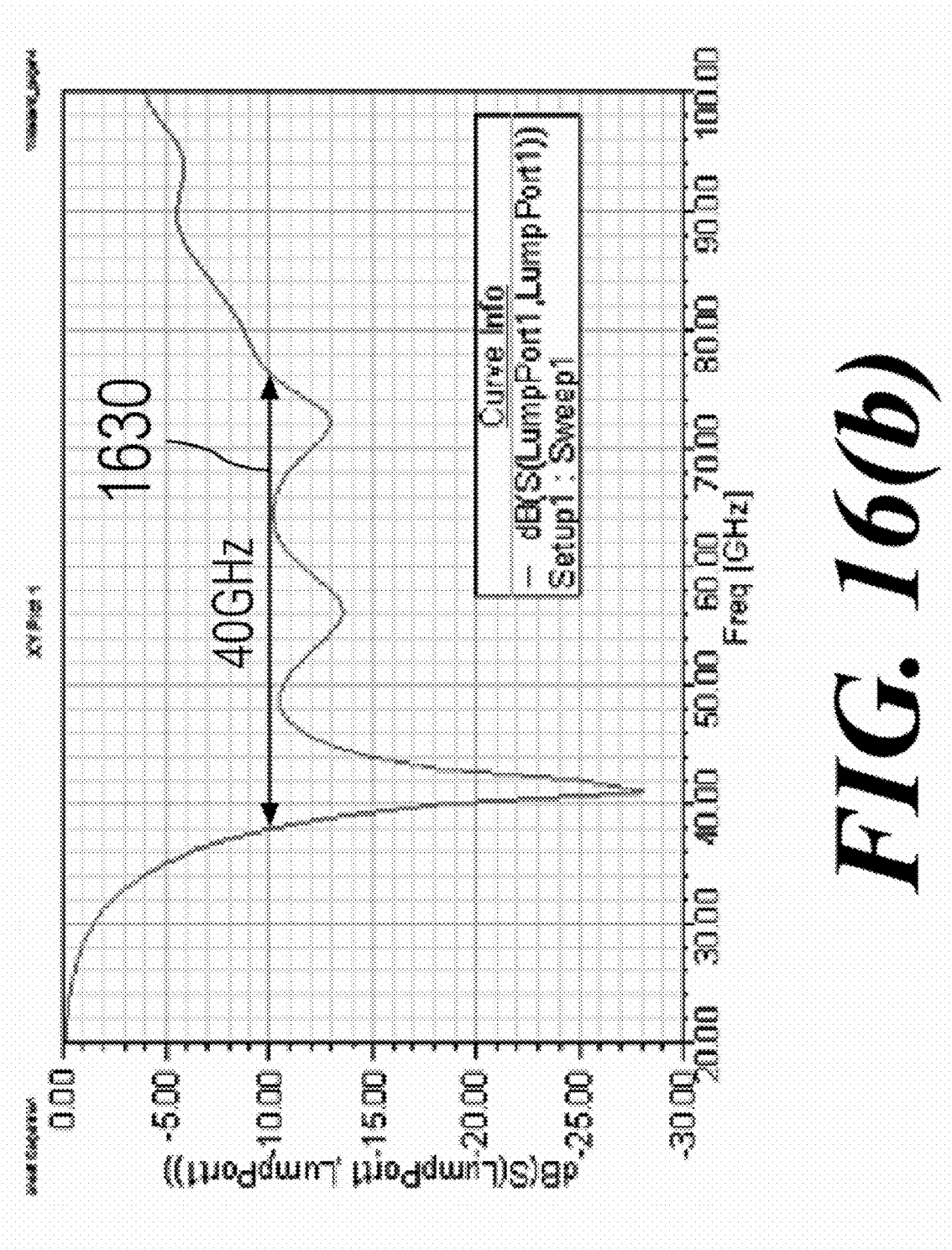
Figure 16C:
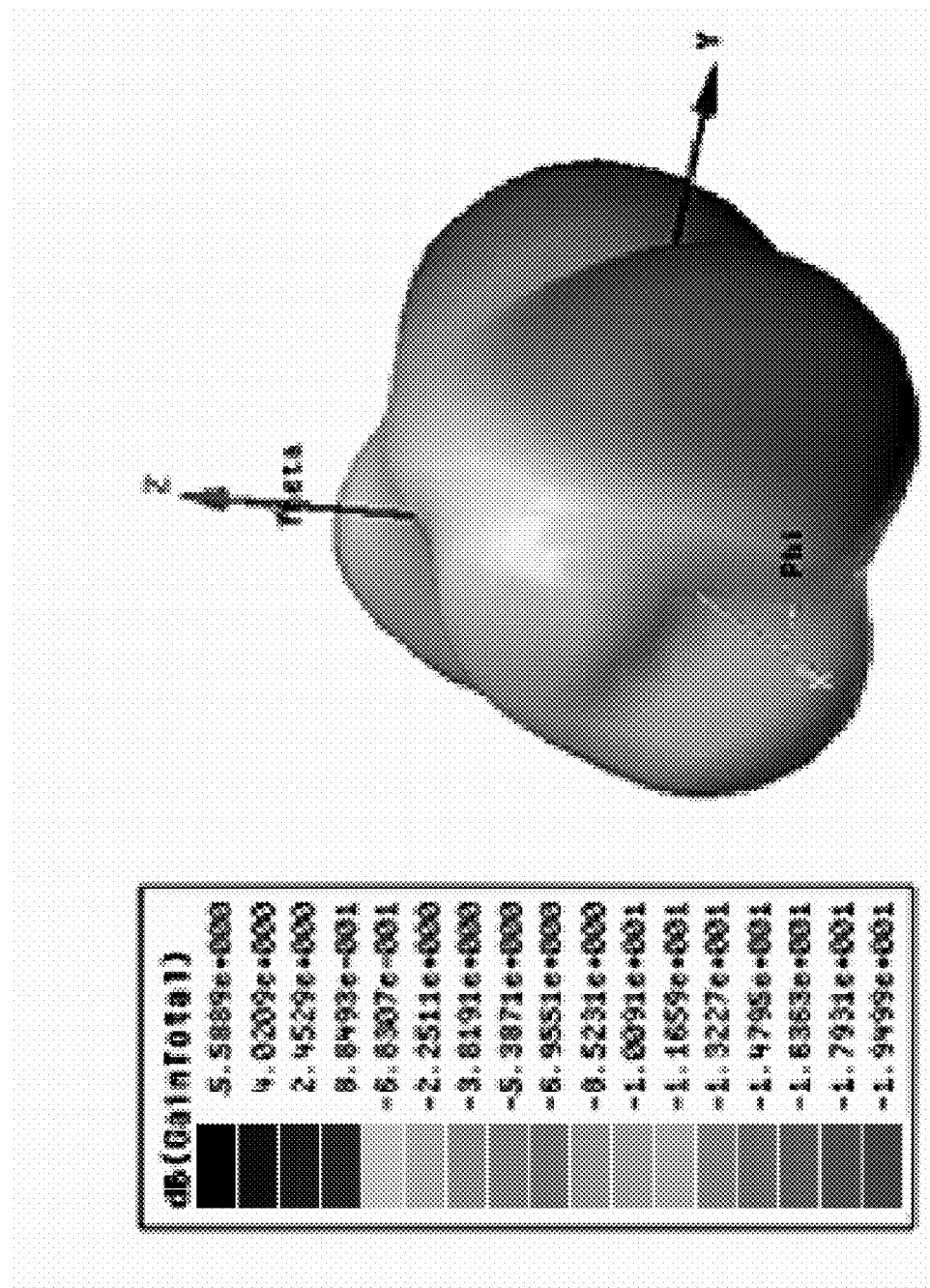

FIG. 16 shows an antenna 1600 according to the thirteenth embodiment with a single-end fed 1616 6-side metal polygon 1618 as the radiator/detector element. FIG. 16(b) shows the bandwidth 1630 achieved is 40 GHz. The 6-side metal polygon 1618 may be designed such that each pair of symmetrical sides contributes one of resonant frequencies. Thus the lengths of the sides of each pair may be adjusted, so that the 3 resonant frequencies can be aligned to be close but still different from each other so that the bandwidths overlap. In this way a desired central frequency can be achieved concurrently with an enlarged bandwidth.

Figure 17:
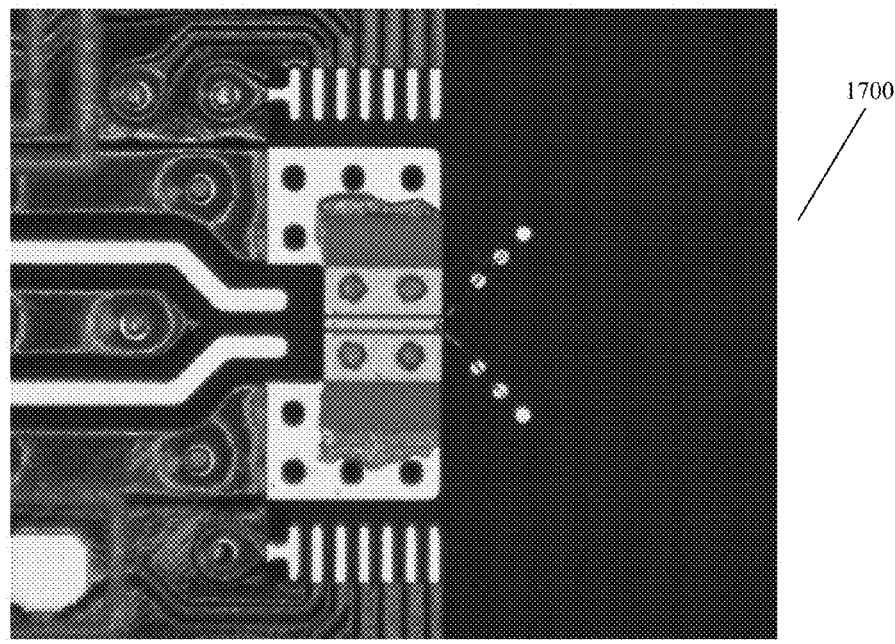
FIG. 17 is a photo of a prototype of the seventh embodiment.

FIG. 17 shows a prototype 1700 of the seventh example embodiment and

Figure 18:
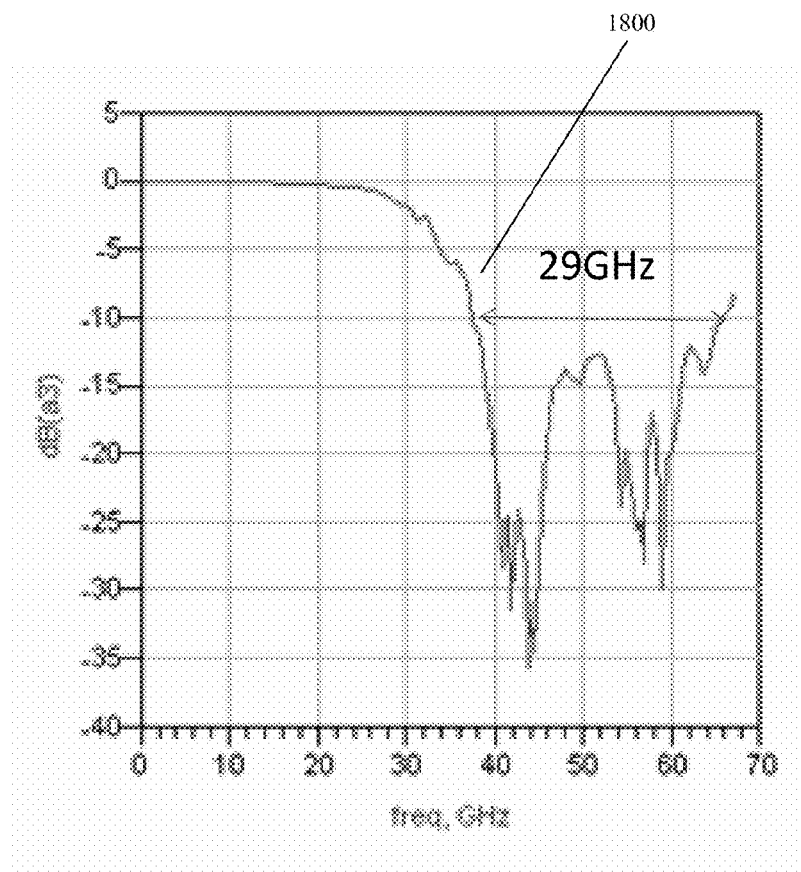
FIG. 18 is a graph of the measured performance of the prototype in FIG. 17.

FIG. 18 shows the performance 1800 of the prototype 1700.

Figure 19:
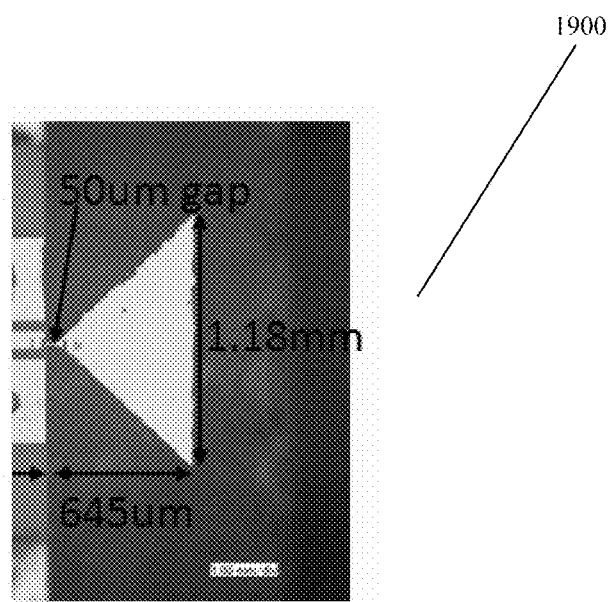
FIG. 19 is a photo of a prototype of the eighth example embodiment.

FIG. 19 shows a prototype 1900 of the eighth example embodiment.

While example embodiments of the invention have been described in detail, many variations are possible within the scope of the invention as will be clear to a skilled reader.

The invention claimed is:

1. A method of manufacturing an antenna comprising:
   providing a millimeter wave (MMW) antenna attached to a signal pad on an integrated circuit mounted on a substrate, and
   adjusting one or more parameters of the antenna to conform to predetermined desired thresholds, levels or ranges, wherein the adjustment is selected from the group consisting of:
      locating a conducting or dielectric object at a desired tuner location in proximity to the antenna to tune a central signal frequency,
      locating a conducting reflector at a desired reflector location in proximity to the antenna to tune a radiation direction or pattern, and
      selecting a conducting patch or object as a radiator/detector element to modify bandwidth, wherein providing the antenna comprises connecting two wires to one of: a single feed or a differential feed as the radiator/detector element.

2. The method of claim 1, wherein the two wires with the single feed comprise a two armed monopole antenna.

3. The method of claim 1, wherein providing the antenna comprises connecting four wires to a differential feed as the radiator/detector elements.

4. The method of claim 3, wherein the four wires with the differential feed comprise a J-pole antenna with two arms in positive and negative ports.

5. The method of claim 1, wherein providing the antenna further comprises attaching each wire to a bond pad on the substrate.

6. The method of claim 1, wherein providing the antenna comprises connecting a single triangular box to the single feed as the radiator/detector element.

7. The method of claim 1, wherein providing the antenna comprises connecting two triangular patches to the single feed as the radiator/detector elements.

8. The method of claim 1, wherein providing the antenna comprises connecting four triangle patches to the differential feed as the radiator/detector elements.

9. The method of claim 1, wherein providing the antenna comprises connecting two triangular boxes to the differential feed as the radiator/detector elements.

10. The method of claim 1, wherein providing the antenna comprises connecting a six side polygon to the single feed as the radiator/detector element.

11. The method of claim 1, wherein locating the conducting or dielectric object comprises attaching a dielectric cylinder to the substrate at the desired tuner location.

12. The method of claim 11, further comprising determining the desired tuner location by measuring the central signal frequency with the conducting or dielectric object at a plurality of locations.

13. The method of claim 1, wherein locating the conducting or dielectric object comprises attaching a metallic cylinder to the substrate at the desired tuner location.

14. The method of claim 1, wherein locating the conducting or dielectric object comprises attaching a dielectric triangular box to the substrate at the desired tuner location.

15. The method of claim 1, wherein the desired reflector location is underneath the substrate and adjacent to a side of the integrated circuit distant from the signal pad.

16. The method of claim 1, wherein the desired reflector location is underneath the substrate and adjacent to a side of the integrated circuit adjacent to the signal pad.

17. The method of claim 1, further comprising encapsulating the antenna in a dielectric or resin material.

18. The method of claim 1, further comprising providing a ground plane between the substrate and the integrated circuit.

19. A millimeter wave (MMW) antenna comprising:
   a feed attached to a signal pad on an integrated circuit mounted on a substrate;
   a ground plane between the substrate and the integrated circuit; and
   one or more of:
      a conducting or dielectric object at a desired tuner location in proximity to the antenna operable to tune a central signal frequency,
      a conducting reflector at a desired reflector location in proximity to the antenna operable to tune a radiation direction or pattern,
      a conducting patch or object as a radiator/detector element attached to the feed to modify the bandwidth.

20. A millimeter wave (MMW) antenna comprising:
   a feed attached to a signal pad on an integrated circuit mounted on a substrate; and
   a dielectric object at a desired tuner location in proximity to the antenna operable to tune a central signal frequency, wherein the dielectric object comprises one or more of: a dielectric cylinder, a metallic cylinder, and a dielectric triangular box attached to the substrate at the desired tuner location.

21. A method of manufacturing an antenna comprising:
   providing a millimeter wave (MMW) antenna attached to a signal pad on an integrated circuit mounted on a substrate, and
   adjusting one or more parameters of the antenna to conform to predetermined desired thresholds, levels or ranges, wherein the adjustment comprises:
      locating a conducting or dielectric object at a desired tuner location in proximity to the antenna to tune a central signal frequency,
      locating a conducting reflector at a desired reflector location in proximity to the antenna to tune a radiation direction or pattern,
      selecting a conducting patch or object as a radiator/detector element to modify bandwidth, and
      encapsulating the antenna in a dielectric or resin material.

\* \* \* \* \*